(12) United States Patent
Jo et al.

(10) Patent No.: US 12,112,813 B2
(45) Date of Patent: Oct. 8, 2024

(54) DEVICE FOR DETERMINING READ REFERENCE VOLTAGE OF A MEMORY DEVICE AND OPERATING METHOD THEREOF

(71) Applicants: SK hynix Inc., Icheon (KR); Korea Advanced Institute of Science and Technology, Daejeon (KR)

(72) Inventors: Sunyoung Jo, Daejeon (KR); Jungwuk Park, Daejeon (KR); Younghyun Park, Daejeon (KR); Sang Ho Yun, Icheon (KR); Jaekyun Moon, Daejeon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 174 days.

(21) Appl. No.: 17/847,056

(22) Filed: Jun. 22, 2022

(65) Prior Publication Data
US 2023/0298677 A1    Sep. 21, 2023

(30) Foreign Application Priority Data
Jan. 28, 2022  (KR) .......................... 10-2022-0013649

(51) Int. Cl.
*G11C 16/34*  (2006.01)
*G06N 3/045*  (2023.01)
*G11C 16/28*  (2006.01)

(52) U.S. Cl.
CPC ......... *G11C 16/3431* (2013.01); *G06N 3/045* (2023.01); *G11C 16/28* (2013.01)

(58) Field of Classification Search
CPC ................ G11C 16/3431; G11C 16/28; G11C 29/50004; G11C 29/028; G06N 3/045
See application file for complete search history.

(56) References Cited

U.S. PATENT DOCUMENTS 8,953,373 B1    2/2015  Wu et al.
9,741,402 B2    8/2017  Jeon
(Continued)

FOREIGN PATENT DOCUMENTS

KR    1020210026767 A    3/2021

OTHER PUBLICATIONS

Berry, M. W. et al., "Algorithms and applications for approximate nonnegative matrix factorization," 2007, Computational statistics & data analysis, 52(1): 155-173.
(Continued)

*Primary Examiner* — Ernest Unelus

(57) ABSTRACT

A device includes a threshold voltage distribution estimation network configured to generate an estimated distribution using a feature distribution and read trial information, a set of feature distributions generated from a plurality of threshold voltage distributions for a plurality of pages of a memory device, and a read reference voltage estimation network configured to generate a read reference voltage from the estimated distribution. The read trial information includes a read trial vector and an output value, the output value being generated by applying the read trial vector to a threshold voltage distribution for a page to be read among the plurality of threshold voltage distributions.

17 Claims, 8 Drawing Sheets

(56) References Cited

U.S. PATENT DOCUMENTS

2020/0210831 A1     7/2020   Zhang et al.
2021/0295942 A1*   9/2021   Yamaki ................ G11C 29/028

OTHER PUBLICATIONS

Cai, Y. et al., "Error characterization, mitigation, and recovery in flash-memory-based solid-state drives," 2017, Proceedings of the IEEE, 105(9): 1666-1704.

Cai, Y. et al., "Threshold voltage distribution in MLC NAND flash memory: Characterization, analysis, and modeling," In 2013 Design, Automation & Test in Europe Conference & Exhibition (DATE), 2013, pp. 1285-1290, IEEE.

Cai, Y. et al., "Read disturb errors in MLC NAND flash memory: Characterization, mitigation, and recovery," In 2015 45th Annual IEEE/IFIP International Conference on Dependable Systems and Networks, 2015, pp. 438-449, IEEE.

Cai, Y. et al., "Data retention in MLC NAND flash memory: Characterization, optimization, and recovery," In 2015 IEEE 21st International Symposium on High Performance Computer Architecture (HPCA), 2015, pp. 551-563, IEEE.

Choe, H. et al., "Machine-Learning-Based Read Reference Voltage Estimation for NAND Flash Memory Systems Without Knowledge of Retention Time," 2020, IEEE Access, 8: 176416-176429.

Fevotte, C. and Idier, J., "Algorithms for nonnegative' matrix factorization with the β-divergence," Neural computation, 2011, 23(9): 2421-2456.

Ho, K.-C. et al., "A 45nm 6b/cell charge-trapping flash memory using LDPC-based ECC and drift-immune softsensing engine," In 2013 IEEE International Solid-State Circuits Conference Digest of Technical Papers, 2013, pp. 222-223, IEEE.

Janecek, A. and Tan, Y., "Iterative improvement of the multiplicative update nmf algorithm using nature-inspired optimization," In 2011 Seventh International Conference on Natural Computation, vol. 3, 2011, pp. 1668-1672, IEEE.

Kim, C. et al., "A 512-GB 3-b/Cell 64-stacked WL 3-D-NAND flash memory. IEEE Journal of Solid-State Circuits," 2017, 53(1): 124-133.

Lee, D. D. and Seung, H. S., "Learning the parts of objects by non-negative matrix factorization," Nature, 1999, 401(6755): 788-791.

Li, Q. et al., "A fast read retry method for 3D NAND flash memories using novel valley search algorithm," IEICE Electronics Express, 2018, 15-20180921.

Li, Q. et al., "Sentinel cells enabled fast read for {NAND} flash," In 11th {USENIX} Workshop on Hot Topics in Storage and File Systems (HotStorage 19), 2019.

Luo, Y. et al., "HeatWatch: Improving 3D NAND flash memory device reliability by exploiting self-recovery and temperature awareness," In 2018 IEEE International Symposium on High Performance Computer Architecture (HPCA), 2018, pp. 504-517. IEEE.

Mei, Z.et al., "Deep learning-aided dynamic read thresholds design for multi-level-cell flash memories," 2020, IEEE Transactions on Communications, 68(5): 2850-2862.

Peleato, B. et al., "Towards minimizing read time for NAND flash," In 2012 IEEE Global Communications Conference (GLOBECOM), 2012, pp. 3219-3224, IEEE.

Peter, R. et al., "Evaluation of SVD and NMF methods for latent semantic analysis," 2009, International Journal of Recent Trends in Engineering, 1(3): 308.

Shang, L. et al., "Image reconstruction using NMF with sparse constraints based on kurtosis measurement criterion," In International Conference on Intelligent Computing, 2009, pp. 834-840, Springer.

Wang, C. et al., "DNN-aided read-voltage threshold optimization for MLC flash memory with finite block length" 2020, arXiv preprint arXiv:2004.05340.

Wang, Z et al., "Semi-NMF-Based Reconstruction for Hyperspectral Compressed Sensing," 2020, IEEE Journal of Selected Topics in Applied Earth Observations and Remote Sensing, 13: 4352-4368.

Zhou, H et al., "Error-correcting schemes with dynamic thresholds in nonvolatile memories," In 2011 IEEE International Symposium on Information Theory Proceedings, 2011, pp. 2143-2147, IEEE.

* cited by examiner

DEVICE FOR DETERMINING READ REFERENCE VOLTAGE OF A MEMORY DEVICE AND OPERATING METHOD THEREOF

CROSS-REFERENCE TO RELATED APPLICATION

The present application claims priority under 35 U.S.C. § 119(a) to Korean Patent Application No. 10-2022-0013649, filed on Jan. 28, 2022, which is incorporated herein by reference in its entirety.

BACKGROUND

1. Technical Field

Various embodiments generally relate to a device for determining read reference voltage of a memory device and an operating method thereof.

2. Related Art

In a flash memory device, threshold voltage of a flash cell changes according to data written to the flash cell.

The threshold voltage of the flash cell has a statistical distribution according to stored data, but distortion occurs in the distribution depending on usage state or noise of the flash cell.

Therefore, even when a read reference voltage is provided to the flash cell in consideration of a desirable threshold voltage distribution during a read operation, the read operation may fail and an error may occur.

Accordingly, a plurality of read trials are performed while changing a read reference voltage provided to the flash cell.

As density of a NAND flash memory device increases, lowering an error rate during such a memory read trial greatly affects performance of the NAND flash memory device.

If the number of read trials is increased to reduce errors, performance of the memory device is deteriorated due to an increase in time delay.

SUMMARY

In accordance with an embodiment of the present disclosure, a device may include a threshold voltage distribution estimation network configured to generate an estimated distribution using a feature distribution and read trial information, a set of feature distributions being generated from a plurality of threshold voltage distributions for a plurality of pages of a memory device; and a read reference voltage estimation network configured to generate a read reference voltage from the estimated distribution, wherein the read trial information includes a read trial vector and an output value, the output value being generated by applying the read trial vector to a threshold voltage distribution for a page to be read among the plurality of threshold voltage distributions.

In accordance with an embodiment of the present disclosure, a method for determining a read reference voltage may include generating a read trial information corresponding to a threshold voltage distribution for a page among a plurality of threshold voltage distributions for a plurality of pages; generating a combination coefficient vector by applying the read trial information to a coefficient estimation network; generating a feature distribution from the plurality of threshold voltage distributions for the plurality of pages; generating an estimation distribution by using the combination coefficient vector and the feature distribution; and estimating a read reference voltage by applying the estimation distribution to a read reference voltage estimation network.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and beneficial aspects of those embodiments.

DETAILED DESCRIPTION

The following detailed description references the accompanying figures in describing illustrative embodiments consistent with this disclosure. These embodiments are provided for illustrative purposes and are not exhaustive. Additional embodiments not explicitly illustrated or described are possible. Further, modifications can be made to the presented embodiments within the scope of teachings of the present disclosure. The detailed description is not meant to limit embodiments of this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

FIGS. 1A to 1E are graphs illustrating an operation to determine a read reference voltage according to the present disclosure.

In FIGS. 1A to 1E, a horizontal axis indicates threshold voltage and a vertical axis indicates number of cells.

Figure 1D:
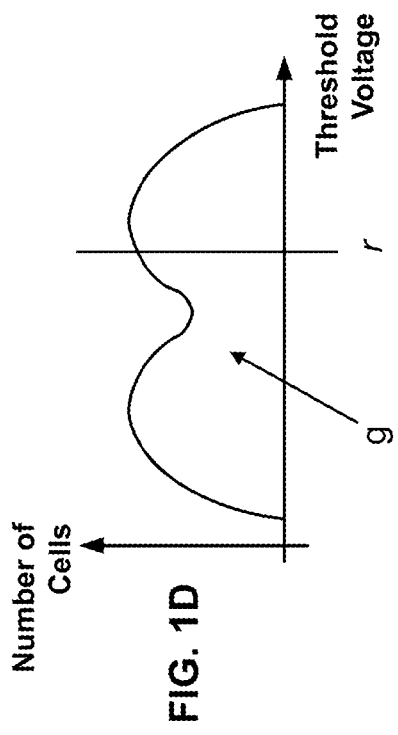
FIGS. 1A, 1B, 1C, 1D, and 1E are graphs each illustrating an operation to determine a read reference voltage according to an embodiment of the present disclosure.
Figure 1E:
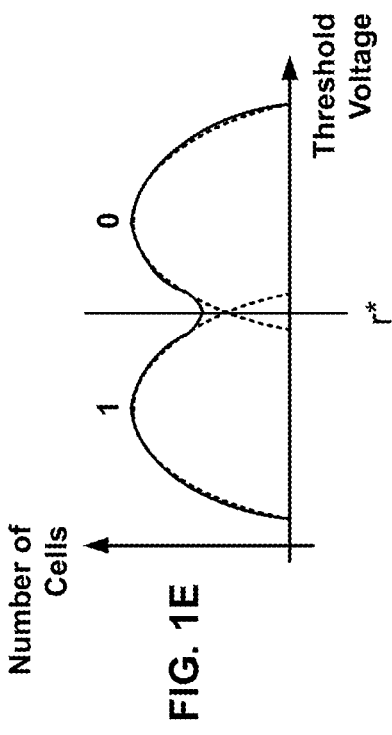
Figure 1A:
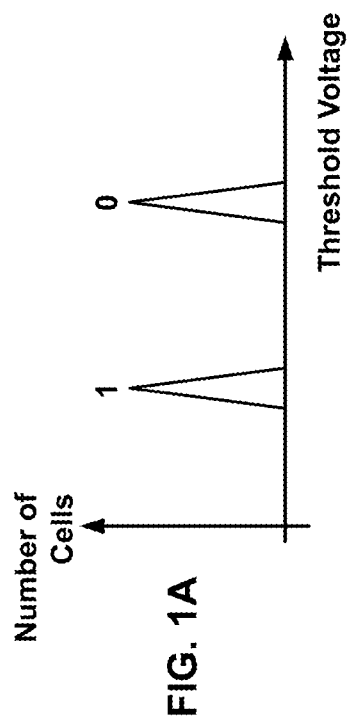

FIG. 1A shows, for example, a threshold voltage distribution at the initial stage of writing data to flash memory cells of one page.

In FIGS. 1A to 1E, it is considered that data "1" is written when the threshold voltage is low, and it is considered that data "0" is written when the threshold voltage is high.

Figure 1B:
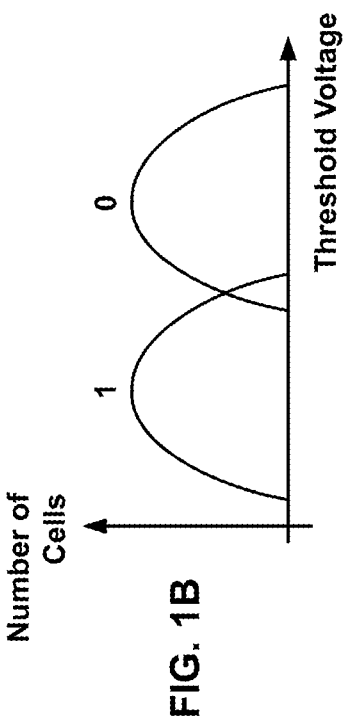
Figure 1C:
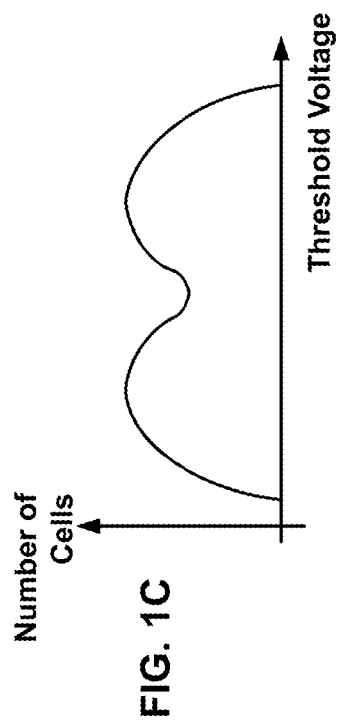

As time elapses, the distribution of the threshold voltage is expanded as shown in FIG. 1B due to stress or noise applied to the flash memory cells, and as a result, the distribution changes as shown in FIG. 1C.

FIG. 1D shows a read trial voltage r provided during a read trial and an output value g corresponding thereto.

In FIGS. 1A to 1E, the read trial voltage r is a scalar value because data stored in the flash memory cell has a single level.

In a NAND flash memory device that reads in a page unit, the read trial output value g corresponds to the number of flash memory cells each having a threshold voltage less than the read trial voltage r among a plurality of flash cells included in a page. In the distribution graph of FIG. 1D, the read trial output value g may correspond to an integration of the distribution graph between 0 and r.

When several bits are stored in a flash memory cell, a plurality of read trial voltages r may exist, and the read trial voltage r may be expressed as a vector including these as elements thereof.

For example, a read trial voltage for a multilevel flash cell (MLC) storing 2 bits may have 3 elements, and a read trial voltage for a triple level flash cell (TLC) storing 3 bits may have 7 elements. Hereinafter, a read trial voltage may be represented as a read trial voltage r. A read trial voltage for a single level flash cell (SLC) may also be represented as a vector having a single element.

As shown in FIG. 1E, a read trial voltage r* that minimizes an error is determined in the present embodiment.

When the value of g is determined while gradually increasing the read trial voltage r in FIG. 1D, a valley point (or a local minimum) of the distribution graph can be found, and this can be used as a read reference voltage.

However, this method may require a large number of read trials, and the number of read trials may further increase as data levels stored in one memory cell increases.

In an embodiment of the present disclosure, a neural network technique is used to reduce the number of read trials as well as to estimate an optimal read reference voltage.

Hereinafter, a specific embodiment of the present disclosure will be described by taking a TLC type NAND flash memory device as an example.

<Threshold Voltage Distribution>

A cell voltage distribution corresponding to a data level i is represented by a vector fi. Hereinafter, each vector is assumed to be a row vector.

Figure 2:
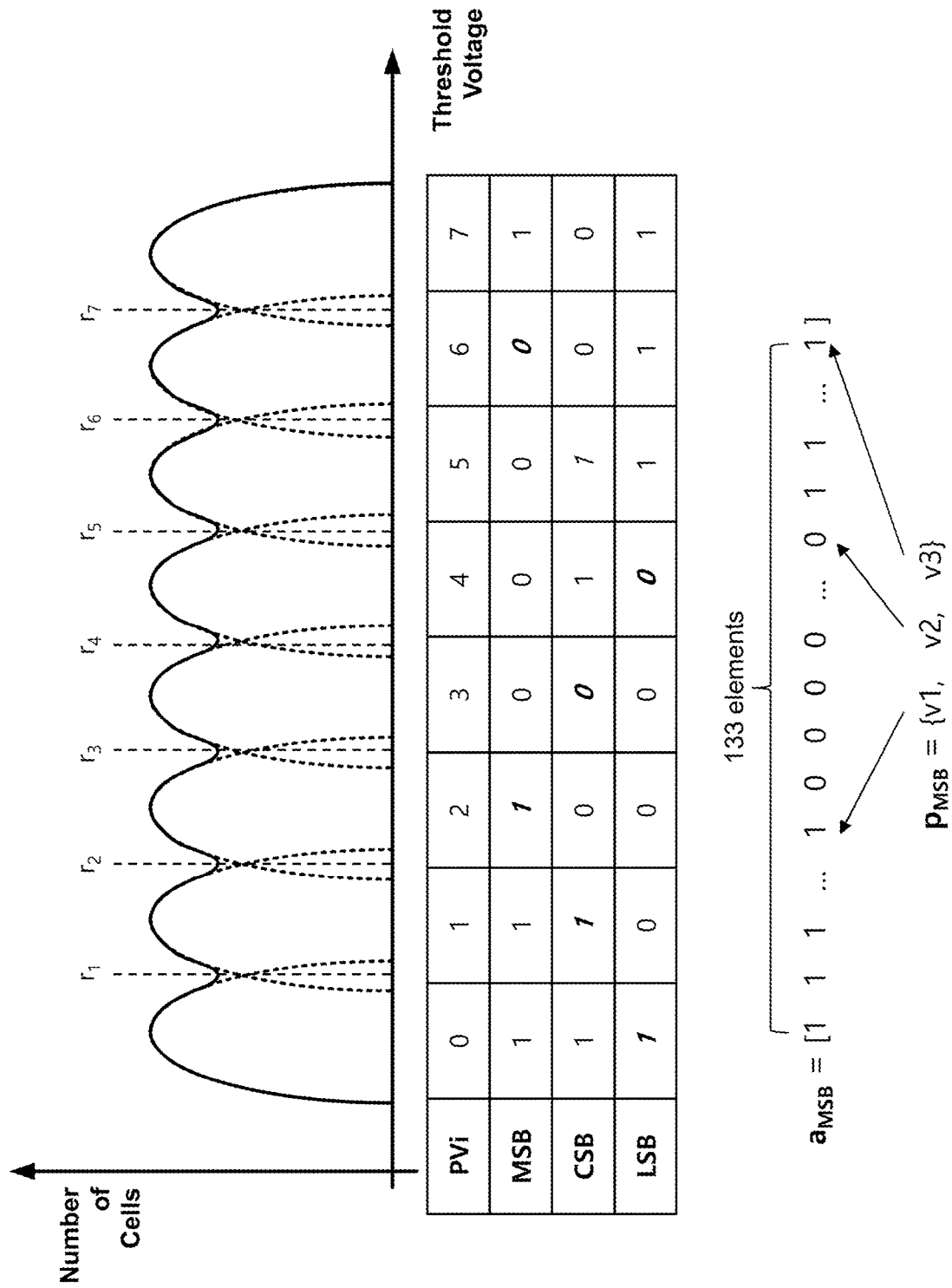
FIG. 2 illustrates a threshold voltage distribution of a NAND flash memory device according to an embodiment of the present disclosure.

In the embodiment shown in FIG. 2, a range where the threshold voltage can exist is divided into a predetermined number (e.g., 133) of sections.

That is, a threshold voltage belongs to any one of 133 sections, and the cell voltage distribution vector fi also has 133 elements. Each element thereof represents the number of flash memory cells each having a threshold voltage belonging to a corresponding section within one page that is a read unit.

In the TLC NAND flash memory device, i is an integer from 0 to 7, and accordingly, there are 8 cell voltage distribution vectors fi.

The threshold voltage distribution vector x is an element-wise accumulation of 8 cell voltage vectors fi and may be expressed as Equation 1.

$$x = \Sigma_i f_i \quad \text{[Equation 1]}$$

x is a threshold voltage distribution vector corresponding to a single page, and the entire data set corresponding to a plurality of pages may be represented by a matrix X. In an embodiment, a threshold voltage distribution vector x corresponding to a page is included as a row of the matrix X.

<Read Error and Read Reference Voltage>

Since the TLC NAND flash memory device has 8 data levels, there are 7 read reference voltages, which can be expressed as a read reference voltage vector $r=\{r_1, \ldots, r_7\}$.

A read error e corresponds to the number of cells whose levels are incorrectly determined when a read operation is performed using a given read reference voltage vector r.

For example, a decision window corresponding to the i-th reference voltage corresponds to a window between a section number corresponding to $r_i$ and a section number corresponding to $r_{i+1}$.

A memory cell existing within the decision window corresponds to a memory cell whose data level is correctly determined.

Accordingly, the read error e corresponds to the accumulated value of the flash memory cells existing outside the corresponding decision window, and may be expressed as Equation 2.

In Equation 2, a section number corresponding to $r_i$ is denoted by $c_i$, and a section number corresponding to $r_{i+1}$ is denoted by $c_{i+1}$. In Equation 2, $c_0$ corresponds to 1, which is the minimum value of the section number, and $c_8$ corresponds to 133, which is the maximum value of the section number.

$$e = \sum_{i=0}^{i=7} \left[ 1_{1 \times c_i} \quad 0_{1 \times (c_{i+1}-c_i)} \quad 1_{1 \times (133-c_{i+1})} \right] f_i^T \quad \text{[Equation 2]}$$

<Read Trial of a TLC NAND Flash Memory Device>

FIG. 2 is a graph illustrating a threshold voltage distribution of a TLC NAND memory device according to an embodiment.

The graph of FIG. 2 is an extension of the graph of FIG. 1E to a TLC memory device, and seven reference voltages $r_2, r_2, \ldots, r_7$ may be used to distinguish each data level from the remaining data levels.

In FIG. 2, the data level of the TLC NAND flash memory device is indicated by $PV_i$ (i=0, 1, 2, ..., 7) in the direction in which the threshold voltage of a memory cell increases.

The relationship between a data level and an actual data bit may be predetermined.

In an embodiment, when the data level increases from the lowest level (i=0) to the highest level (i=7), the actual data bits may be encoded in a sequentially decreasing manner from "111" to "000." However, embodiments of the present disclosure are not limited thereto.

In other embodiments, the relationship between the threshold voltage and the data may be determined or encoded in different ways.

In the embodiment of FIG. 2, it is assumed that the most significant bit (MSB), the middle bit (CSB), and the least significant bit (LSB) are determined, such that the data level $PV_0$ corresponds to "111" and the data level $PV_7$ corresponds to "101."

In an embodiment, a read trial is performed on any one of MSB, CSB, and LSB, which may be selected randomly.

In the embodiment of FIG. 2, the number of elements in the read trial vector is related to the number of points at which data bit transitions as the data level $PV_i$ increases.

For example, two transitions occur for MSB and LSB, and three transitions occur for CSB as shown in FIG. 2.

In an embodiment, in order to encompass the three cases, a read trial vector p is expressed as a vector having three elements like Equation 3.

$$p = \{v_1, v_2, v_3\} \quad \text{[Equation 3]}$$

As described above, the whole range of the threshold voltage may be divided into 133 sections and each section number may be used as an index. In Equation 2, the index is expressed as $c_i$ (i=1, 2, 3, . . . , 133).

Each element $v_1$, $v_2$, and $v_3$ of the read trial vector p corresponds to a corresponding section number. Accordingly, in the case of MSB and LSB, the value of $v_3$, which is the third element, is fixed to 133.

Given a read trial vector p, a corresponding integration vector a is determined. As shown in FIG. 2, since the first section of all MSB, CSB, and LSB is given as 1, the integration vector a may be determined like Equation 4.

$$a = [1_{1 \times v_1} 0_{1 \times (v_2 - v_1)} 1_{1 \times (v_3 - v_2)} 0_{1 \times (133 - v_3)}]_{1 \times 133} \quad \text{[Equation 4]}$$

FIG. 2 shows a read trial vector $p_{MSB}$ and an integration vector $a_{MSB}$ used for reading the MSB according to an embodiment. In this case, each arrow indicates that an element of the read trial vector $p_{MSB}$ is related to an index of the integration vector $a_{MSB}$ where data transitions.

An output value g corresponding to a read trial may be expressed as Equation 5, which corresponds to the number of 1s included in a predetermined range.

$$g = \Sigma f_i a^T = x a^T \quad \text{[Equation 5]}$$

In order to estimate the threshold voltage distribution more accurately, multiple read trials may be performed on a single page to estimate the threshold voltage distribution. Hereinafter, the total number of read trials may be expressed as M (M is a natural number greater than 1), and a read trial variable may be expressed as m (1≤m≤M).

The total number of read trials M according to an embodiment of the present disclosure is significantly reduced compared to that of conventional read trials. For example M may be 3.

A read trial vector p and a corresponding output value g may be referred to as read trial information.

As described above, when a read trial is performed, any one bit type among MSB, CSB, and LSB is selected randomly, and each element of the read trial vector is also randomly determined according to the selected bit type.

An embodiment of the present disclosure aims at determining the read reference voltage.

As described above, the read reference voltage may be a vector having 7 elements and is expressed as r={$r_1$, ..., $r_7$}.

If the individual threshold voltage distribution fi corresponding to each data level is accurately known, the desired read reference voltage vector r* may be determined to minimize the accumulated value of the read error of Equation 2, which can be expressed as Equation 6.

$$r^* \arg\min \sum_{i=0}^{7} \left[ \sum_{v=0}^{r_i} f_i + \sum_{v=r_i+1}^{133} f_i \right] \quad \text{[Equation 6]}$$

However, at the time of performing the read operation, information other than read trial information may not be provided to estimate the read reference voltage, and the threshold voltage distribution may not be accurately known in advance.

Accordingly, in an embodiment, the read reference voltage is determined by transforming the optimization problem of Equation 6 into the following two problems.

The first problem is the problem of reconstructing the threshold voltage distribution using the read trial information, and the second problem is estimating the read reference voltage from the reconstructed threshold voltage distribution.

Figure 3:
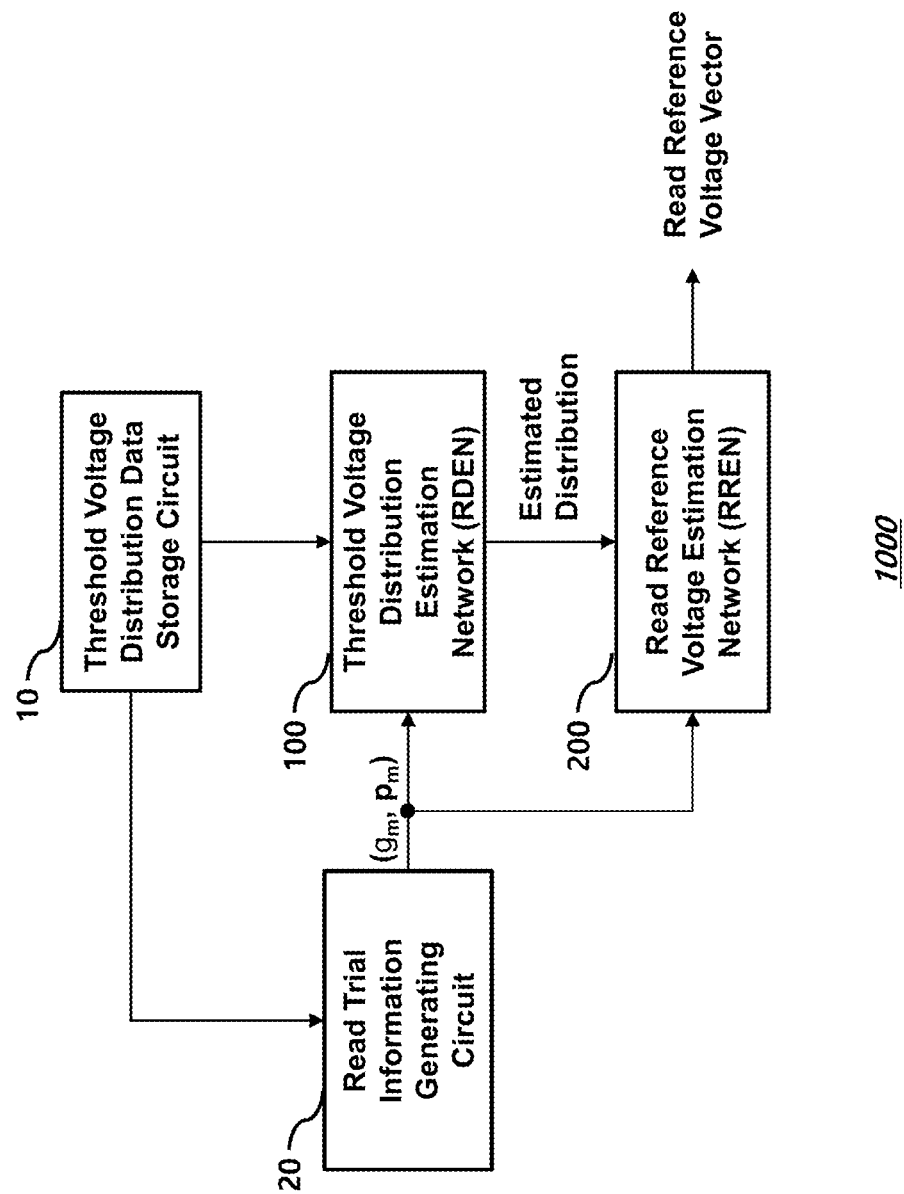
FIG. 3 illustrates a device for determining a read reference voltage according to an embodiment of the present disclosure.

FIG. 3 is a block diagram illustrating a device 1000 for determining a read reference voltage according to an embodiment of the present disclosure.

The device 1000 for determining a read reference voltage includes a threshold voltage distribution estimation network 100 and a read reference voltage estimation network 200.

In an embodiment, each of the threshold voltage distribution estimation network 100 and the read reference voltage estimation network 200 includes a neural network that can be independently learned, and may be provided in hardware, software, or a combination thereof.

The threshold voltage distribution estimation network 100 restores the threshold voltage distribution using pre-stored threshold voltage distribution data and a relatively small amount of read trial information.

The read reference voltage estimation network 200 determines a read reference voltage vector using the restored threshold voltage distribution and a relatively small amount of read trial information.

The threshold voltage distribution data storage circuit 10 stores threshold voltage distribution data previously accumulated for a plurality of pages.

The read trial information generating circuit 20 generates a plurality of read trial information by using a threshold voltage distribution previously accumulated for a plurality of pages.

Figure 4:
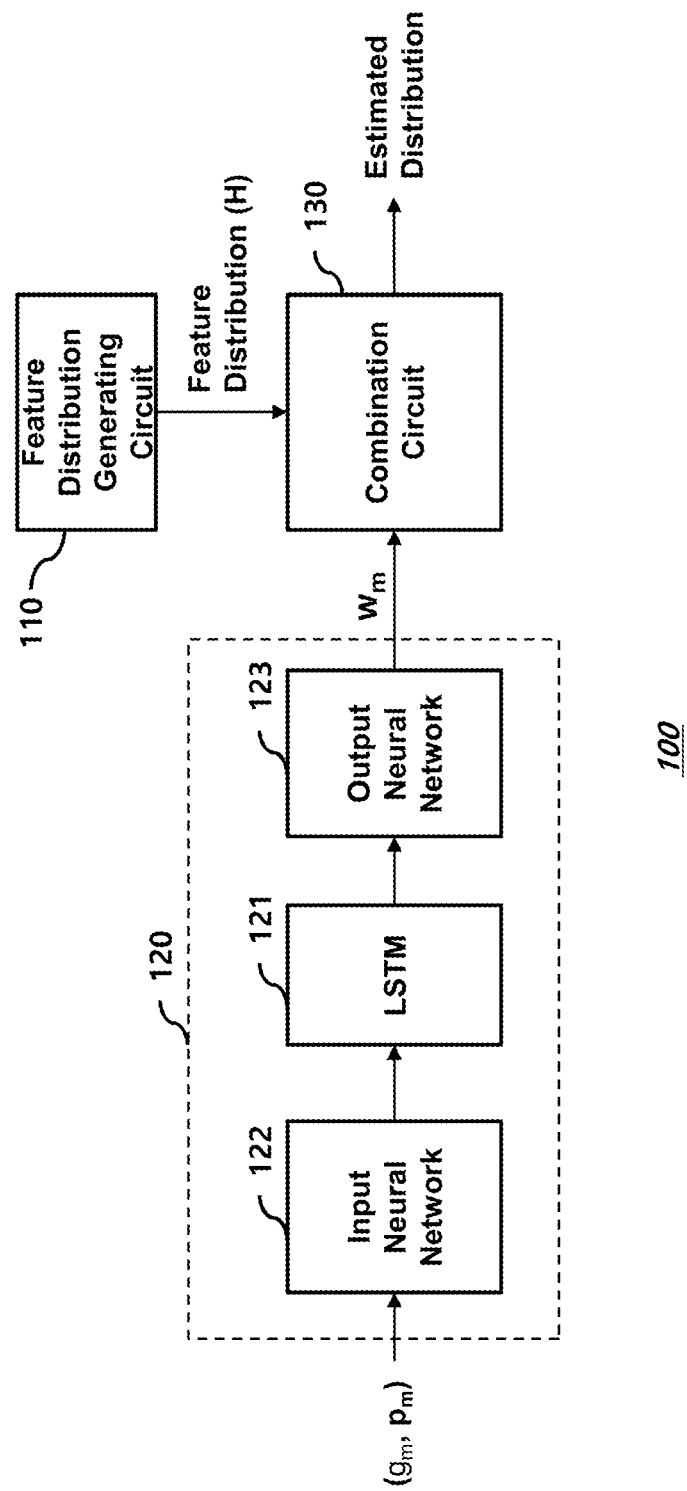
FIG. 4 illustrates a threshold voltage distribution estimation network according to an embodiment of the present disclosure.

FIG. 4 is a block diagram illustrating a threshold voltage distribution estimation network 100 according to an embodiment.

The threshold voltage distribution estimation network 100 includes a feature distribution generating circuit 110, a coefficient estimation network 120, and a combination circuit 130.

The feature distribution generating circuit 110 generates a feature distribution matrix by applying Non-negative Matrix Factorization (NMF) technique to a matrix including a plurality of threshold voltage distributions for a plurality of pages.

As described above, a threshold voltage distribution for each page can be expressed as a threshold voltage distribution vector x, and a threshold voltage distribution matrix X can be obtained by including a plurality of threshold voltage distribution vectors x as row vectors.

If the threshold voltage distribution matrix is denoted by X, the feature distribution matrix is denoted by H, and the coefficient matrix is denoted by W, the relation between the matrixes X, H, and W can be expressed as X=WH. In an embodiment, the feature distribution matrix H corresponds to the basis matrix extracted by the NMF technique.

All elements of the threshold voltage distribution matrix X have positive values in nature. Thus, the feature distribution generating circuit 110 may apply NMF technique to the threshold voltage distribution matrix X to generate the feature distribution matrix H and the coefficient matrix W, and the feature distribution matrix H may be used to generate a restored threshold voltage distribution as will be described below. Since various NMF techniques including those known in the art may be used to determine the feature distribution matrix H when the threshold voltage distribution matrix X is given, in light of teachings of the present disclosure, detailed descriptions on the configuration and operation of the feature distribution generating circuit 110 will be omitted for the interest of brevity.

The feature distribution generating circuit 110 may determine and store the feature distribution matrix H in advance before a learning operation and an inference operation.

The combination circuit 130 outputs a restored threshold voltage distribution by linearly combining a plurality of feature vectors included in the feature distribution matrix.

In an embodiment, coefficients for linearly combining a plurality of feature vectors are output from the coefficient estimation network 120.

The coefficient estimation network 120 generates a combination coefficient vector $w_m$ for combining a plurality of feature vectors using the read trial information ($g_m$, $p_m$). The combination circuit 130 may generate the restored threshold voltage distribution (or estimation distribution) by combining a plurality of features vectors included in the feature distribution matrix H using coefficients in the combination coefficient vector $w_m$, the combination coefficient vector $w_m$ being generated by the coefficient estimation network 120 using the read trial information ($g_m$, $p_m$).

The read trial information is provided up to M times, and accordingly, the combination coefficient vector $w_m$ is also regenerated M times, and the finally generated combination coefficient vector $w_m$ can be used.

Since the read trial vector and output value included in the read trial information are described above, a detailed description thereof will be omitted.

The coefficient estimation network 120 includes a Long Short-Term Memory (LSTM) network 121 as a main neural network 121. The LSTM network 121 may be a network known to those skilled in the art, and detailed description thereof will be omitted.

The coefficient estimation network 120 may include an input neural network 122 connected to an input node of the LSTM network 121, or an output neural network 123 connected to an output node of the LSTM network 121 to match dimensions between the read trial information and the combination coefficient vector, or both.

In an embodiment, the input neural network 122 and the output neural network 123 are fully connected neural networks, but embodiments of the present disclosure are not limited thereto.

The threshold voltage distribution data storage circuit 10 in FIG. 3 stores a plurality of threshold voltage distributions for a plurality of pages.

In a learning process, the read trial information generating circuit 20 selects threshold voltage distribution data for any one page among a plurality of pages and generates a plurality of read trial vectors and a plurality of output values corresponding thereto using selected threshold voltage distribution data and performs a learning operation for the coefficient estimation network 120.

Thereafter, learning may be additionally performed by selecting threshold voltage distribution data for another page and generating a plurality of read trial information corresponding thereto.

Figure 6:
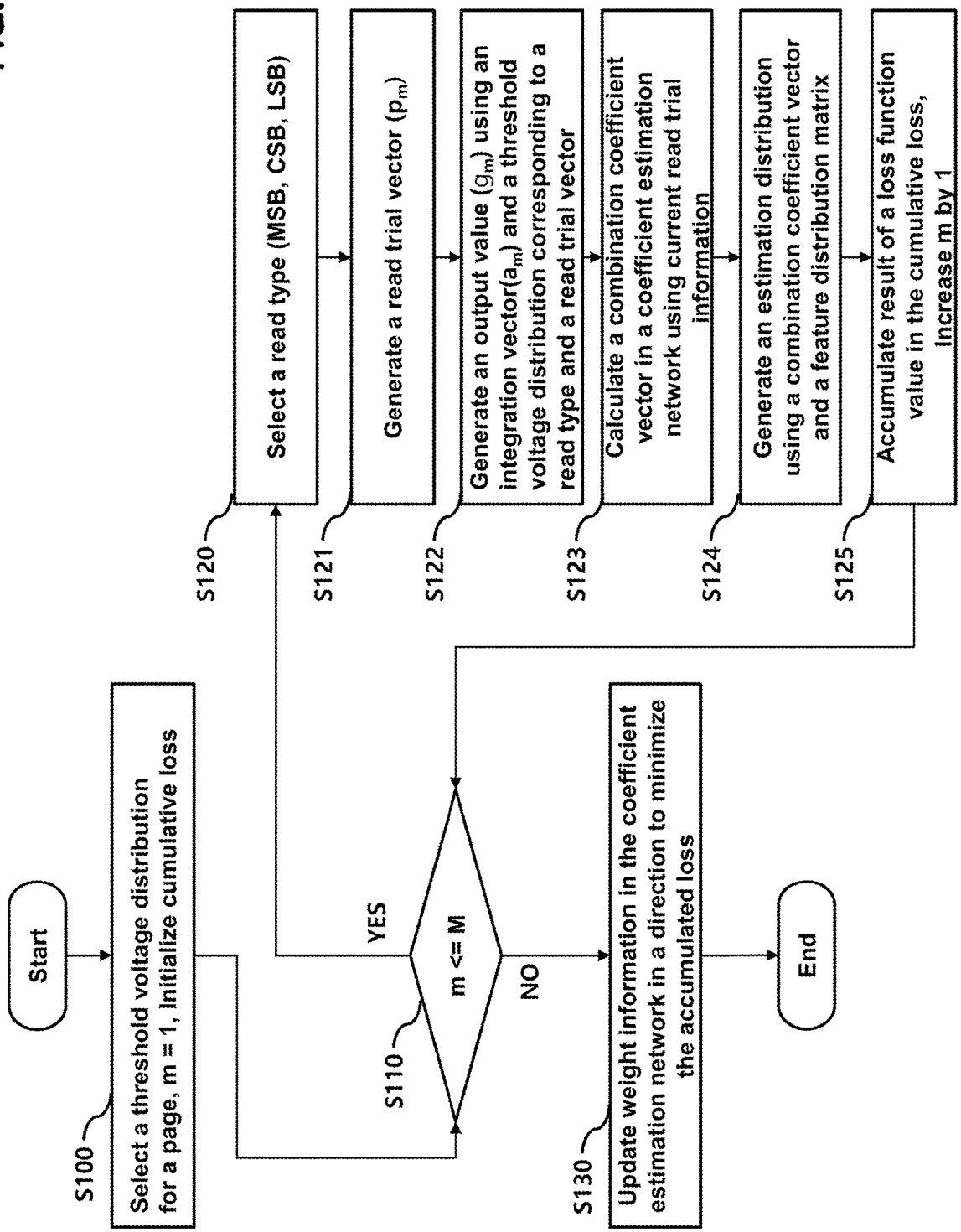
FIG. 6 is a flowchart showing a learning operation of a threshold voltage distribution estimation network according to an embodiment of the present disclosure.

FIG. 6 is a flowchart illustrating a learning operation for the threshold voltage distribution estimation network 100 of FIG. 4, according to an embodiment.

First, a threshold voltage distribution for one page is selected, and a read trial variable m and a cumulative loss are initialized at S100.

It is determined whether the read trial variable (or the number of read trials) is less than or equal to the maximum value (or the total number of read trials) M at S110, and if it is less than or equal to the maximum value M, a read type is selected at S120.

The read type is a read operation for any bit type among the most significant bit (MSB), the middle bit (CSB), and the least significant bit (LSB). In an embodiment, any one of MSB, CSB, and LSB is randomly selected.

Thereafter, a read trial vector $p_m$ corresponding to the read type as shown in Equation 3 is selected at S121.

Thereafter, an integration vector $a_m$ is generated as shown in Equation 4, and an output value $g_m$ is generated as shown in Equation 5 at S122 using the threshold voltage distribution selected at S100 and an integration vector $a_m$, for example, through scalar product of the threshold voltage distribution selected at S100 and the integration vector $a_m$.

A combination coefficient vector $w_m$ is calculated by the coefficient estimation network 120 using the currently generated read trial information at S123.

The combination circuit 130 generates an estimated distribution using the combination coefficient vector $w_m$ and the feature distribution matrix H at S124.

Thereafter, a loss function is calculated and a result thereof is added to the cumulative loss at S125. After that, the variable m is incremented by 1.

In an embodiment, the loss function can be calculated as the sum of two components, and can be expressed as Equation 7.

The first component is the distance between the threshold voltage distribution x and the estimated distribution $w_m H$, and the second component is the distance between the output value $g_m$ derived by applying the integration vector $a_m$ to a selected threshold voltage distribution x and a value derived by applying the integration vector $a_m$ to the restored voltage distribution $w_m H$.

$$L_1 = l(x, w_m H) + l(g_m, w_m H a_m) \quad \text{[Equation 7]}$$

If the variable m is equal to or less than the maximum value M at S110, the process proceeds to S120 and repeats the above-described operation to update the accumulated loss value.

If the variable exceeds the maximum value M at S110, weight information of the neural network used in the coefficient estimation network is updated in a direction to minimize the cumulative loss at S130.

The flowchart of FIG. 6 shows a case where the learning process is performed using the threshold voltage distribution for one page, and an additional learning operation may be performed using the threshold voltage distribution for the remaining pages. In addition, the learning operation for the entire page may be repeatedly performed a plurality of times.

Returning to FIG. 1, the read reference voltage estimation network 200 generates a read reference voltage corresponding to the restored threshold voltage distribution.

Figure 5:
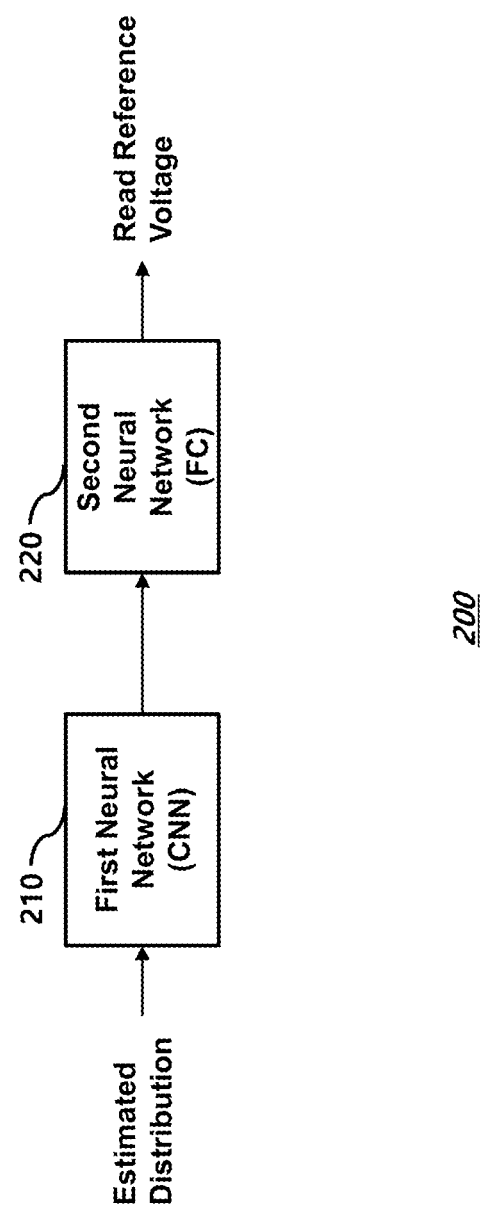
FIG. 5 is a block diagram of a reference voltage estimation network according to an embodiment of the present disclosure.

FIG. 5 is a detailed block diagram illustrating the read reference voltage estimation network 200 according to an embodiment.

In the embodiment of FIG. 5, the read reference voltage estimation network 200 includes a first neural network 210 such as a convolutional neural network (CNN), receives an estimated distribution, and outputs a read reference voltage.

The read reference voltage estimation network 200 may further include a second neural network (e.g., a fully connected neural network) 220 connected to an output node of the first neural network 210 in order to adjust number of dimensions.

Figure 7:
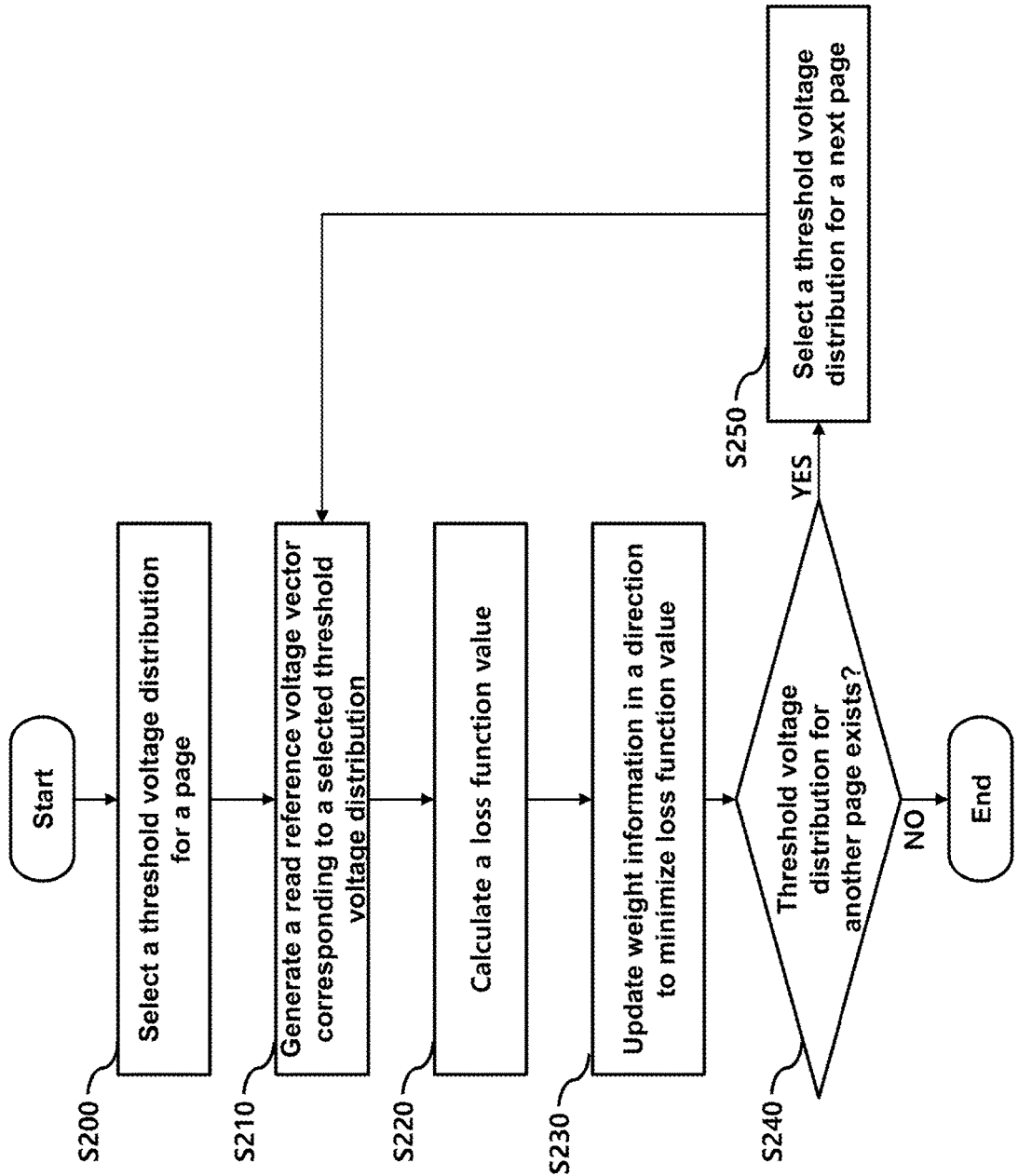
FIG. 7 is a flowchart showing a learning operation of a reference voltage estimation network according to an embodiment of the present disclosure.

FIG. 7 is a flowchart illustrating a learning process for the read reference voltage estimation network 200 according to an embodiment.

In an embodiment, the learning operation for the read reference voltage estimation network 200 may be performed independently from the learning operation for the threshold voltage distribution estimation network 100.

First, a threshold voltage distribution for one page is selected at S200.

Thereafter, a read reference voltage vector is generated by inputting the selected threshold voltage distribution at S210.

That is, in the learning process, the selected threshold voltage distribution is input to the read reference voltage estimation network 200 instead of the estimated distribution output from the threshold voltage distribution estimation network 100.

Thereafter, a loss function value is calculated according to the distance between the read reference voltage vector r* known in advance and the read reference voltage vector r at S220.

Thereafter, the weight information of the read reference voltage estimation network 200 is updated in a direction to minimize the loss function value at S230.

Thereafter, it is determined whether a threshold voltage distribution of another page exists at S240, and if there is a threshold voltage distribution for the next page is selected at S250, the process returns to S210 and repeats the above-described operation.

Learning operation as shown in the flowchart of FIG. 7 may be performed multiple times repeatedly.

Figure 8:
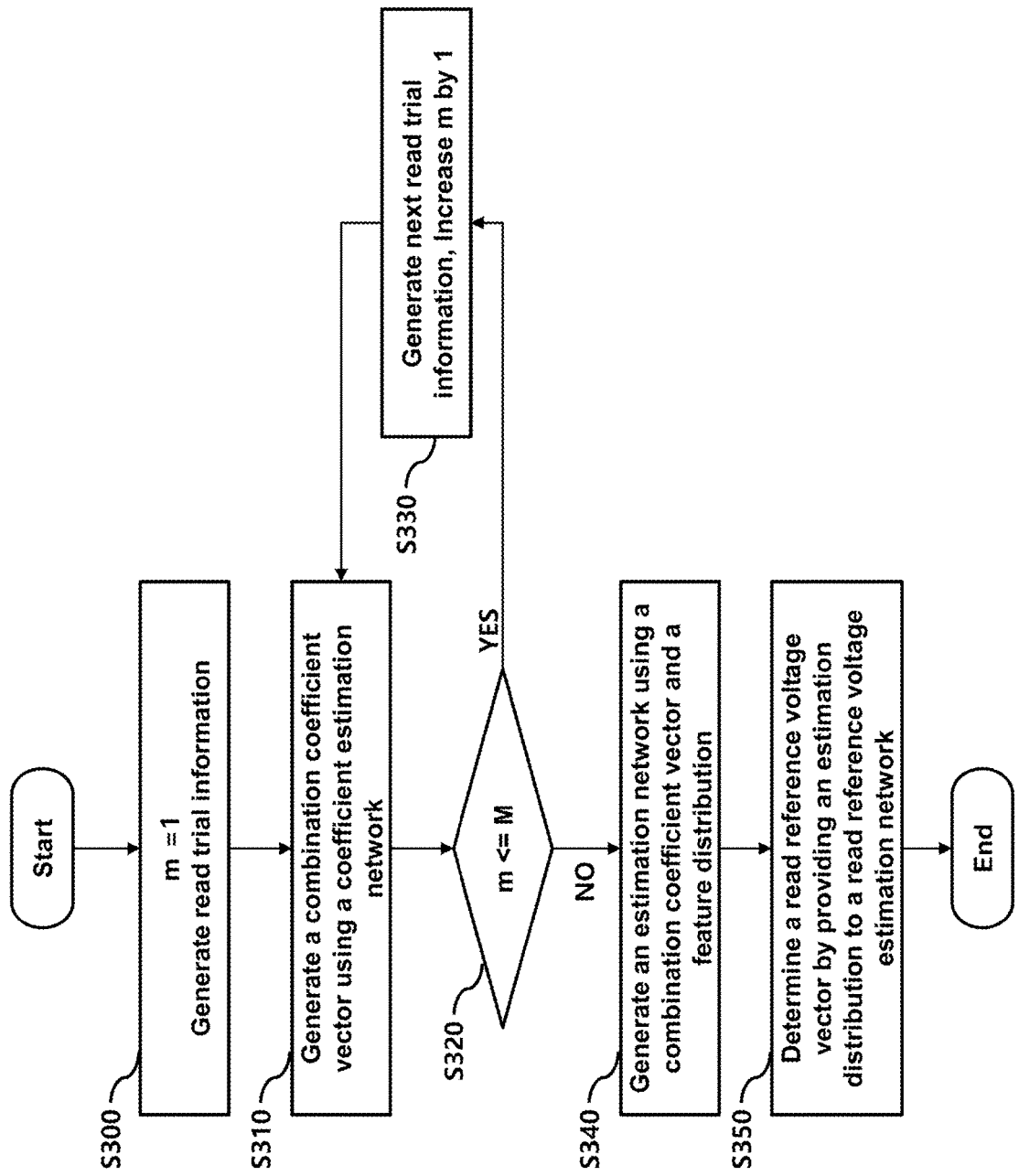
FIG. 8 is a flowchart showing an inference operation of a device for determining a read reference voltage estimation according to an embodiment of the present disclosure.

FIG. 8 is a flowchart illustrating an inference operation of the device 1000 for determining a read reference voltage vector according to an embodiment of the present disclosure.

First, the variable m is initialized to 1 and a read trial information is generated at S300.

As described above, the read trial information includes a read trial vector $p_m$ and an output value $g_m$ corresponding thereto.

In this case, the output value $g_m$ may be generated by applying the read trial vector $p_m$ to the threshold voltage distribution corresponding to a page to be read.

Thereafter, a combination coefficient vector is generated by providing the read trial information to the coefficient estimation network 120 of the threshold voltage distribution estimation network 100.

Next, it is determined whether the variable m is equal to or less than the maximum value M at S320. If the variable m is less than or equal to the maximum value M, the read trial variable m is incremented by 1 and next read trial information is generated.

As described above, M is the maximum number of read trials, and M may be 3 according to an embodiment of the present disclosure, which is a significantly smaller number compared to that of the prior art.

Thereafter, the process proceeds to S310 to re-generate the combination coefficient vector.

When the variable m exceeds M, the threshold voltage distribution estimation network 100 generates an estimated distribution by combining the finally generated combination coefficient vector and the feature distribution matrix at S340.

Finally, the read reference voltage vector is generated by providing the estimated distribution to the read reference voltage estimation network 200 at S350.

As described above, in according to embodiments of the present disclosure, the operation performance of the memory device can be improved by determining the read reference voltage vector through a relatively small number of read trials.

Although various embodiments have been illustrated and described, various changes and modifications may be made to the described embodiments without departing from the spirit and scope of the invention as defined by the following claims.

What is claimed is:

1. A device comprising:
a threshold voltage distribution estimation network configured to generate an estimated distribution matrix using a feature distribution matrix and read trial information, the threshold voltage distribution estimation network including a feature distribution generating circuit and a combination circuit, the feature distribution generating circuit configured to generate the feature distribution matrix from a plurality of threshold voltage distributions for a plurality of pages of a memory device, the combination circuit configured to generate the estimation distribution matrix by combining a plurality of vectors included in the feature distribution matrix using a combination coefficient vector; and
a read reference voltage estimation network configured to generate a read reference voltage from the estimated distribution matrix,
wherein the read trial information includes a read trial vector and an output value, the output value being generated by applying the read trial vector to a threshold voltage distribution for a page to be read among the plurality of threshold voltage distributions, and
wherein the threshold voltage distribution estimation network further includes a coefficient estimation network configured to generate the combination coefficient vector from the read trial information.

2. The device of claim 1, wherein the coefficient estimation network includes a main neural network generating the combination coefficient vector according to the read trial information.

3. The device of claim 2, wherein the coefficient estimation network further includes an input neural network receiving the read trial information and providing an output to the main neural network, and an output neural network receiving an output of the main neural network and providing the combination coefficient vector.

4. The device of claim 1, wherein the feature distribution matrix corresponds to a basis matrix extracted from a matrix including the plurality of threshold voltage distributions for the plurality of pages using a Non-negative Matrix Factorization (NMF) technique.

5. The device of claim 1, wherein the read reference voltage estimation network includes a first neural network configured to receive the estimated distribution matrix and generate the read reference voltage.

6. The device of claim 5, wherein the read reference voltage estimation network further includes a second neural network receiving an output of the first neural network and generating the read reference voltage.

7. The device of claim 1, wherein the memory device stores multibit data including a most significant bit (MSB) and a least significant bit (LSB) in a memory cell, and
wherein the read trial vector includes a plurality of elements selected according to a read trial, the read trial being performed for the MSB or the LSB.

8. The device of claim 7, wherein a number of the plurality of elements included in the read trial vector is determined by a pattern of the MSB or a pattern of the LSB, each of the pattern of the MSB and the pattern of the LSB depending on data levels stored in the memory cell.

9. The device of claim 7, wherein the output value is generated using an integration vector and the threshold voltage distribution for the page to be read, the integration vector being determined according to the read trial vector.

10. The device of claim 1, wherein the read reference voltage is a read reference voltage vector including a plurality of read reference voltages.

11. A method for determining a read reference voltage distribution, the method comprising:
generating read trial information corresponding to a threshold voltage distribution for a page among a plurality of threshold voltage distributions for a plurality of pages;
generating a combination coefficient vector by applying the read trial information to a coefficient estimation network;
generating, using a feature distribution generating circuit, a feature distribution matrix from the plurality of threshold voltage distributions for the plurality of pages;
generating, using a combination circuit, an estimated distribution matrix by combining a plurality of vectors included in the feature distribution matrix using the combination coefficient vector; and
estimating a read reference voltage by applying the estimated distribution matrix to a read reference voltage estimation network,
wherein generating the feature distribution matrix includes:
generating a threshold voltage distribution matrix from the plurality of threshold voltage distributions for the plurality of pages; and
generating a basis matrix corresponding to the feature distribution matrix by applying a specific technique to the threshold voltage distribution matrix.

12. The method of claim 11, generating the read trial information and generating the combination coefficient vector are performed multiple times.

13. The method of claim 11,
wherein the basis matrix is generated by applying a Non-negative Matrix Factorization (NMF) technique to the threshold voltage distribution matrix.

14. The method of claim 11, further comprising a learning operation of the coefficient estimation network, the learning operation including:
generating a plurality of pieces of read trial information for a page among the plurality of pages;
calculating a cumulative loss by accumulating loss function values when the plurality of pieces of read trial information are applied to the coefficient estimation network; and
updating weights of the coefficient estimation network in a direction to minimize the cumulative loss.

15. The method of claim 11, further comprising a learning operation of the read reference voltage estimation network, the learning operation including:
calculating a loss function value according to the read reference voltage generated when the estimated distribution matrix is applied to the read reference voltage estimation network; and
updating weights of the read reference voltage estimation network in a direction to minimize the loss function value.

16. The method of claim 11, wherein estimating the read reference voltage includes:
applying the estimated distribution matrix to a convolutional neural network (CNN) to generate an output; and
generating the read reference voltage based on the output of the CNN.

17. The method of claim 11, wherein the read reference voltage is a read reference voltage vector including a plurality of read reference voltages.

* * * * *